(12) United States Patent  
Bartington

(10) Patent No.: US 7,298,141 B2
(45) Date of Patent: Nov. 20, 2007

(54) FLUXGATE AND FLUXGATE MAGNETOMETERS

(75) Inventor: Geoffrey William Bartington, Witney (GB)

(73) Assignee: Bartington Instruments Limited (GB)

( * ) Notice: Subject to any disclaimer, the term of this patent is extended or adjusted under 35 U.S.C. 154(b) by 0 days.

(21) Appl. No.: 10/592,409

(22) PCT Filed: Feb. 22, 2005

(86) PCT No.: PCT/GB2005/050020

§ 371 (c)(1),
(2), (4) Date: Sep. 11, 2006

(87) PCT Pub. No.: WO2005/088327

PCT Pub. Date: Sep. 22, 2005

(65) Prior Publication Data

US 2007/0188170 A1    Aug. 16, 2007

(30) Foreign Application Priority Data

Mar. 12, 2004    (GB)    ................... 0405617.2

(51) Int. Cl.
*G01R 33/04*    (2006.01)
(52) U.S. Cl. .................................. 324/253
(58) Field of Classification Search ......... 324/244–260
See application file for complete search history.

(56) References Cited

U.S. PATENT DOCUMENTS 2,432,514 A    12/1947    Depp et al.
4,205,266 A    5/1980    Lichtenberg
6,278,272 B1    8/2001    Scarzello et al.
6,417,665 B1    7/2002    Scarzello et al.
2004/0251897 A1*    12/2004    Pedersen ..................... 324/253

FOREIGN PATENT DOCUMENTS

DE    10224582    12/2003
EP    0604810    7/1994
GB    592394    5/1942
GB    2339294    1/2000
GB    2386199    9/2003

OTHER PUBLICATIONS

Bartington, G., Sensors for Low Level, Low Frequency Magnetic Fields (1994).
ELSEVIER Abstract Accession No. XP004184461, Dezuari et al., "Sensors and Actuators A: Physical", published 1999, vol. 76, pp. 349-355, "Development of a novel printed circuit board technology for inductive device applications".

* cited by examiner

*Primary Examiner*—Jay M Patidar
(74) *Attorney, Agent, or Firm*—Thompson Hine LLP

(57) ABSTRACT

A flexible fluxgate including:
  at least two ferromagnetic or ferrimagnetic, flexible cores;
  at least two sets of a plurality of windings of an electrically conductive material, at least one set of windings being wound around each of the cores; and
  an electrically conductive, flexible shield enclosing the cores and the windings.
The fluxgate may have a considerable length, e.g. several hundreds of meters, and can be arranged in an open loop. The fluxgate may be used in an access control system. Various fluxgate magnetometers are disclosed as well.

20 Claims, 3 Drawing Sheets

FLUXGATE AND FLUXGATE MAGNETOMETERS

CROSS-REFERENCE TO RELATED APPLICATIONS

This application is the United States national phase entry of PCT International Application No. PCT/GB2005/050020 filed Feb. 2, 2005, and claims priority to Great Britain Application No. 0405617.2 filed Mar. 12, 2004.

The present invention relates to fluxgates and fluxgate magnetometers, and more particularly to fluxgate magnetometers that can be used to form an access control system.

BACKGROUND

A fluxgate and its associated electronics can be used to convert static or alternating magnetic field information into an electrical signal for the purpose of measurement and control. The principles of operation are known and can be found in the literature, for example in Bartington G. 1994 Magnetic Fields report for the IEE Colloquium Low Level Low Frequency Magnetic Fields, London 2; 1-9.

A typical prior art fluxgate consists of two magnetic, rigid, cylindrical cores, each of which is surrounded by helical windings of wire over the length of the cores. Both cores and their respective windings are surrounded by a conductive, rigid electrical shield. The typical length of a conventional fluxgate is 10 or 20 cm.

The present inventor has appreciated that for many applications a rigid fluxgate is unsuitable, or impractical.

The inventor has also appreciated that the relatively short length of conventional fluxgates limits their use.

The inventor has also appreciated that in certain applications a fluxgate which is not straight may be of use.

The present invention has been made in view of these limitations.

SUMMARY

The inventor has appreciated that making the entire fluxgate flexible provides unexpected technical advantages. The flexibility of the fluxgate according to the present invention is desirable in itself. In addition, owing to the flexibility a number of embodiments become possible which might otherwise be impractical. In particular, the fluxgate of embodiments of the invention can take a form similar to a shielded cable, and accordingly the fluxgate can be made relatively long without becoming impractical to handle. Whilst a rigid prior art fluxgate might for many purposes become impractical if its length exceeds e.g. 0.5 m, the flexible fluxgate according to the present invention can in some embodiments have a length of many meters, potentially several kilometres.

Owing to its flexibility, the fluxgate can be formed into a loop, and this may in some embodiments be used to protect the perimeter of an object. Hence the fluxgate can be used in an access control system. E.g. if the fluxgate is arranged in a loop, a magnetic object such as a vehicle entering the loop would have an influence on the magnetic field sensed by the fluxgate, and the resulting measurements can be processed so that the access control system can provide an output in response to the magnetic object entering the loop.

An access system can however also be formed by using one or more fluxgates according to the present invention without necessarily being arranged in a loop.

Aspects of the invention are set out in the independent claims. Apparatus aspects corresponding to method aspects disclosed herein are also provided, and vice versa.

BRIEF DESCRIPTION OF THE DRAWINGS

Some preferred embodiments of the invention will now be described by way of example only and with reference to the accompanying drawings, in which.

DETAILED DESCRIPTION

Figure 1:
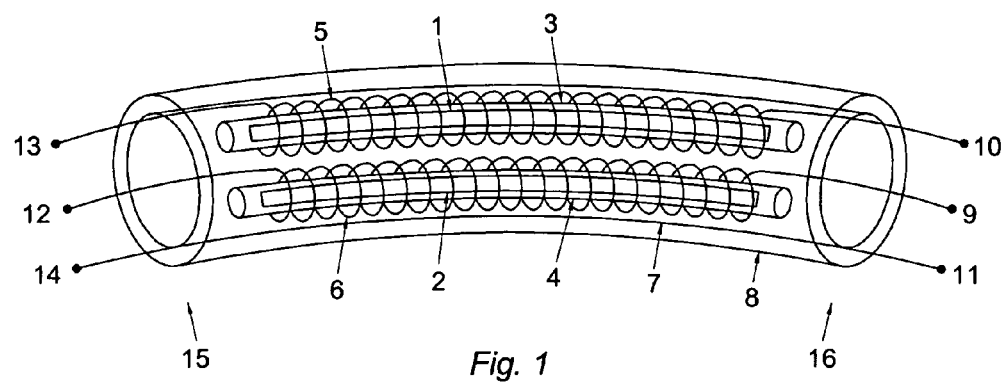
FIG. 1 shows the structure of a fluxgate according to an embodiment of the present invention.

FIG. 1 shows the mechanical structure of a fluxgate according to an embodiment of the present invention.

Two high magnetic permeability saturable, flexible cores 1, 2 are sheathed in loose fitting and electrically insulating, flexible tubes 3, 4. The tubes 3, 4 are each over wound with a set of helical windings 5, 6 of insulated wire over the entire length of the tubes. Only some of the helical windings are shown explicitly, whilst the windings in the middle portion of the figure are indicated by dots. The wire may be coated with insulation or it may be surrounded by insulation material. Preferably there is only one layer (in radial direction) of windings on each core. A conductive electrical shield 7 encloses the cores, tubes and windings. The entire assembly is enclosed in a protective, insulating jacket 8. Materials suitable for the cores 1, 2, the tubes 3, 4, the windings 5, 6, the shield 7 and the jacket 8 will be apparent to those skilled in the art. Preferably, all of these materials are mechanically flexible (or bendable or non-rigid). The cores can be made flexible by making them sufficiently thin, e.g. sufficiently thin in one or two dimensions. By making the cores thin it is possible to use materials which are normally (i.e. if made thicker) not flexible. One suitable core material is Mu metal. A typical composition of Mu metal is 78% Nickel, 20% Ferrous Iron and 2% Molybdenum. Reasonable results have been achieved in trials with thin strips of Mu metal foil of 0.2 mm thickness. The flexibility was improved by reducing the thickness to 0.1 mm and further to 0.05 mm, 0.02 mm and 0.0 mm. Depending on the thickness used it may be advantageous to apply the high magnetic permeability material to a flexible support material. The high magnetic permeability material can for example take the form of an evaporated film. It is also conceivable to make some parts of the fluxgate from a plurality of rigid portions which are connected in a flexible way, e.g. somewhat similar to the scales of a fish.

Electrical connections for the windings 6, windings 5 and the shield 7 are made at each end of the fluxgate. The ends of the fluxgate are identified as first and second axial ends 15, 16, or remote and local ends 15, 16. In use as a fluxgate magnetometer the local end 16 of the fluxgate is connected to driving and processing circuitry, as explained below. The connections at the local end carry reference numbers 9, 10, 11 (respectively for the winding 6, winding 5 and the shield 7), and the corresponding connections at the remote end carry reference numbers 12, 13 and 14.

Figure 2:
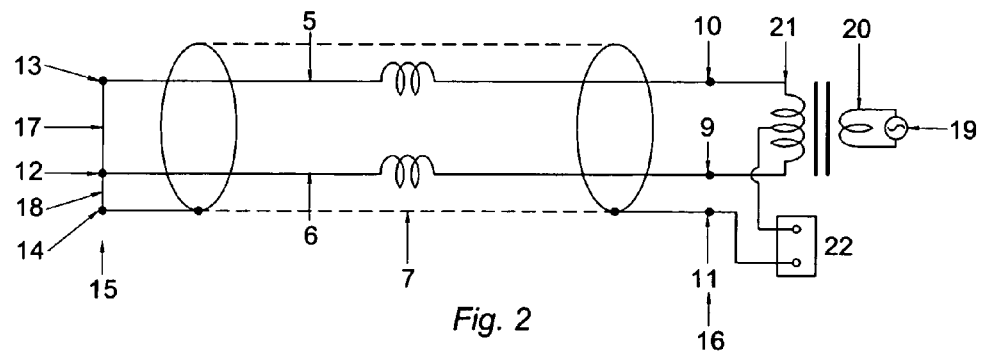
FIG. 2 shows the structure (slightly simplified) of a fluxgate magnetometer according to an embodiment of the present invention.

FIG. 2 shows a first embodiment of a fluxgate magnetometer. Only the windings 5, 6 and the shield 7 are shown, but in strongly simplified representation. The fluxgate of this and the following embodiments of fluxgate magnetometers are preferably as explained in connection with FIG. 1.

In this embodiment, the connections 12, 13, 14 at the remote end 15 are all terminated with a short circuit 17, 18 and at the local end 16 the windings 5, 6 only are terminated with the secondary winding 21 of a transformer. An alternating excitation electrical current is supplied to the primary winding 20 of the transformer at a frequency F Hz by means of AC source 19. The local end terminal 11 of shield 7 is connected to one input of a voltage sensor 22, and a point (preferably the mid-point of the secondary winding 21 of the transformer is connected to the other input of the voltage sensor 22.

In this embodiment, the connections 12, 13, 14 at the remote end 15 are all terminated with a short circuit 17, 18 or a connector or connecting means and at the local end 16 the windings 5, 6 only are terminated with the secondary winding 21 of a transformer. An alternating excitation electrical current is supplied to the primary winding 20 of the transformer at a frequency F Hz by means of AC source 19 or supplying means. The local end terminal 11 of shield 7 is connected to one input of a voltage sensor or sensing means 22, and a point (preferably the mid-point of the secondary winding 21 of the transformer is connected to the other input of the voltage sensor 22. The transformer and AC source 19 may together constitute a non-DC current source, or a means for generating a non-DC electrical current in the windings 10, 11.

The alternating excitation electrical current is of sufficient magnitude to generate a cyclically saturating magnetic field in the helical windings 5, 6. In the presence of a magnetic field H to be sensed and resulting in magnetic flux B=H cos $\phi$ in the cores 1, 2 a voltage Vs having a frequency of 2 F Hz will appear across the inputs of voltage sensor 22.

Figure 5:
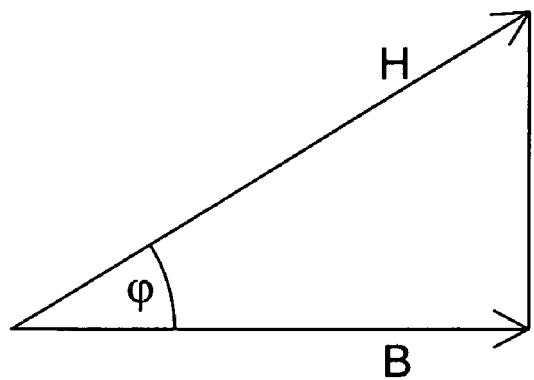
FIG. 5 shows the relationship between the magnetic field and the magnetic flux so as to aid in the understanding of the invention.

The relationship between magnetic flux B and magnetic field H is shown in FIG. 5. The orientation of magnetic field H to be sensed is not necessarily parallel to the cores 1, 2 of the fluxgate, but forms an angle $\phi$ with the cores. This results in a magnetic flux B parallel to the cores 1, 2 of magnitude B=H cos $\phi$.

The magnitude of the sensed voltage Vs will be substantially proportional to the vector sum of the magnetic field flux density at all points along the flexible fluxgate. This embodiment hence enables spatial integration along the length of the fluxgate.

The proportionality is degraded or lost if the measured flux density B exceeds the magnitude of the excitation flux. To counter this, as a refinement of this embodiment a flux may be fed back to the fluxgate via a current in the windings 5, 6 to oppose the measured field and thus increase the accuracy of the measurement under some conditions. This could in some applications be achieved by adding a DC component, or a means for generating a magnetic flux, to the AC excitation provided by source 19. Suitable processing equipment (not shown) includes equipment which first performs an initial measurement (without opposing field), then calculates the required current in the windings 5, 6 for opposing the measured field, then controls source 19 to achieve this current and then performs a refined measurement (with opposing field applied).

Figure 3:
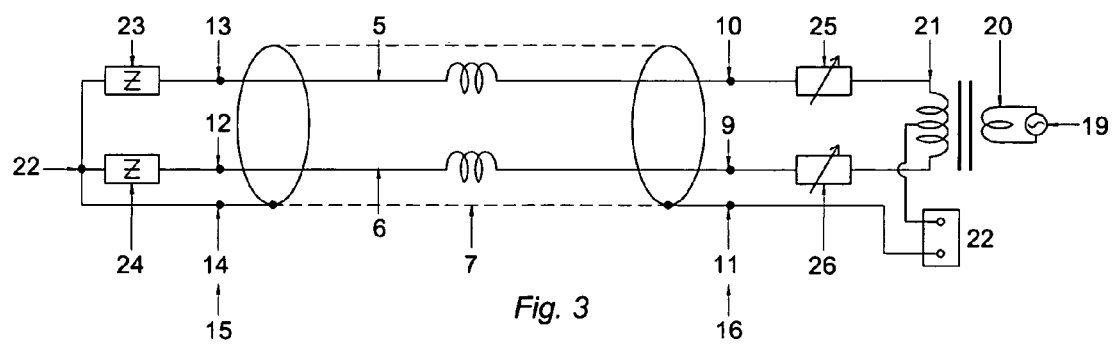
FIG. 3 shows the structure (slightly simplified) of a fluxgate magnetometer according to another embodiment of the present invention.

FIG. 3 shows a second embodiment of a fluxgate magnetometer. Again, only the windings 5, 6 and the shield 7 are shown, but in strongly simplified representation. The electrical connections and mode of operation of this embodiment are similar to those of the first embodiment. The differences to the first embodiment are:

a) The windings 5, 6 are each terminated at their ends with an impedance Z 23, 24, 25, 26, which may be either real or complex. The impedances 25, 26 at the local end are preferably selectively variable in value.

b) The frequency of the excitation signal F is chosen to be sufficiently high so as to cause standing electromagnetic waves to appear along the fluxgate sensor.

By manipulation of the termination impedances 25, 26 at the local end 16 the position of nodes and anti-nodes of the standing wave along the sensor can also be manipulated. In this way the region or regions of the core where cyclic saturation occurs can be manipulated.

The position or positions of the cores 1, 2 where a measured signal can originate (contributing to sensed voltage Vs) are therefore known and provide spatial discrimination of signal sources.

A range of measurements with different values of impedances 25, 26 can be performed and the measurement results collated and processed.

Figure 4:
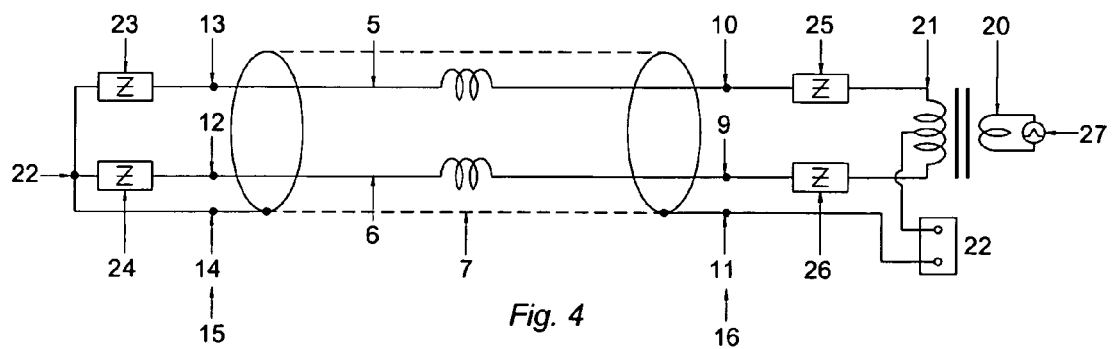
FIG. 4 shows the structure (slightly simplified) of a fluxgate magnetometer according to another embodiment of the present invention.

FIG. 4 shows a third embodiment of a fluxgate magnetometer. Again, only the windings 5, 6 and the shield 7 are shown, but in strongly simplified representation. The electrical connections and mode of operation of this embodiment are similar to those of the second embodiment. The differences to the second embodiment are:

a) The terminating impedances 23-26 are preferably fixed for both ends 15, 16.

b) The continuous wave excitation source 19 has been replaced by a narrow pulse source 27.

By selecting the appropriate impedance value for the remote and local ends 15, 16 of the sensor a travelling wave or pulse can be launched back and forth along the sensor. This relies upon the principle of signal reflection at the remote end 15 back to the local end 16 of the sensor. The portion or portions of the sensor in cyclic saturation at a given point in time and responsible for production of a signal Vs are known as a function of time. This embodiment hence also enables spatial discrimination.

Figure 6:
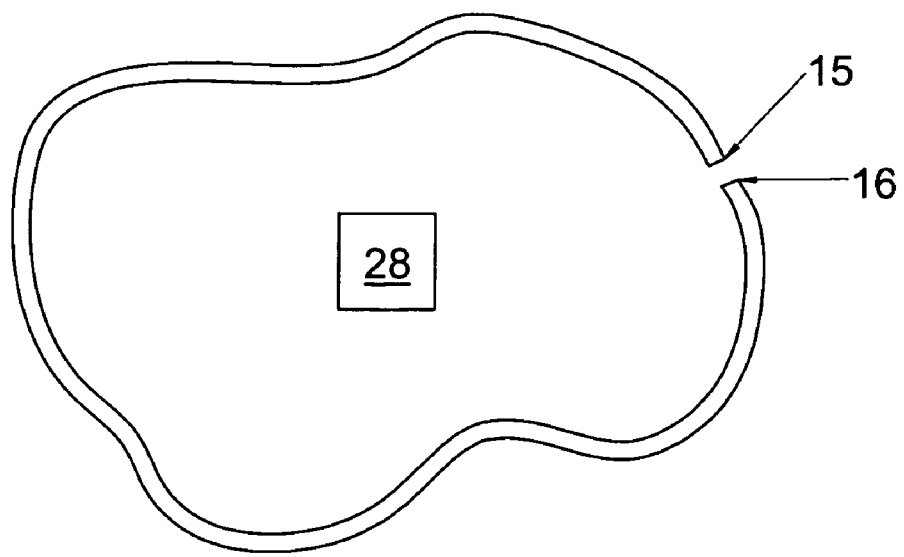
FIG. 6 shows the structure (strongly simplified) of an access control system according to an embodiment of the present invention.

FIG. 6 shows an example of application in simplified representation. The fluxgate, arranged in a loop with local and remote ends 16, 15 in close proximity to each other, forms part of an access control system. Other parts of the access control system such as the circuitry connected to the local and remote ends 16, 15 are not shown. Preferably the circuitry of the fluxgate magnetometer according to the third embodiment is used. Additionally, a processor or similar (not shown) is provided to translate the sensed voltage Vs into information regarding access to the system.

This system can be used for example for controlling or detecting access to the interior of the loop, e.g. object 28 in FIG. 6. E.g. if the loop is arranged in or on the ground and a magnetic object such as a car passes over the perimeter defined by the loop of the fluxgate so as to "enter" the loop this will normally result in a variation of the magnetic field near the fluxgate, and this can be sensed by the system. If the fluxgate magnetometer according to the third embodiment is used it is possible to determine at which position the magnetic object has entered the loop since the time of the variation of the magnetic field sensed by the fluxgate can be translated into positional information, owing to the spatial resolution capabilities of the system.

As an alternative, the fluxgate does not necessarily have to be flexible. A rigid, loop shaped fluxgate could also employed in the access control system.

In other embodiments an access control system is provided using a fluxgate which is not arranged in a loop. For example, a substantially straight or a curved fluxgate can be used to detect magnetic objects passing across the fluxgate.

Several substantially straight or curved fluxgates can also be arranged next to each other, e.g. end-to-end.

In all of the above embodiments and alternatives thereto, whether or not the fluxgate is flexible or not, and whether it is loop shaped or not, it is envisaged that the length of the fluxgate may be more than 0.5 m, preferably more than 1 m, more preferably more than 2 m, and yet more preferably more than 5 m. The fluxgate can be longer than 50 m or several hundreds of meters or several kilometres.

Whilst it is preferred that cores 1, 2 are surrounded by tubes 3, 4, so as to insulate the cores from the windings 5, 6, it is also possible to omit the tubes 3, 4, and purely to rely on insulation provided on the wire material of the windings 5, 6. This insulation may take the form of a coating or an insulating sleeve.

In order to provide flexible cores the particular material described in connection with the first embodiment can be used. Other materials and dimensions may be used. However, the choice of materials and dimensions for the cores is preferably such that the core material is sufficiently thin so that the magnetic properties are not substantially altered by stress/strain induced by flexure.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A fluxgate magnetometer, comprising a fluxgate, said fluxgate comprising:
   at least two cores which are selected from the group consisting of ferromagnetic cores and ferrimagnetic cores;
   at least two sets of a plurality of windings of an electrically conductive material, at least one set of windings being wound around each of said cores; and
   an electrically conductive shield enclosing said cores and said windings,
   wherein the fluxgate has first and second axial ends,
   the fluxgate magnetometer further comprising:
   connecting means for electrically connecting the at least two sets of windings and the shield at the first axial end;
   means for generating a non-DC electric current in said windings; and
   sensing means for sensing, at or near said second axial end, a voltage between the conductive material of one of said sets of windings, or conductive material connected thereto, and said shield.

2. A fluxgate magnetometer according to claim 1, wherein said means for generating a non-DC current in said windings comprises:
   a transformer having primary and secondary windings; and
   supplying means for supplying a non-DC current to the primary winding of the transformer, wherein the secondary winding of the transformer is used to electrically connect the at least two sets of windings at the second axial end.

3. A fluxgate magnetometer according to claim 2, wherein the connecting means short circuits the at least two sets of windings and the shield at the first axial end, wherein the terminals of the secondary winding of the transformer are electrically connected to the at least two sets of windings at the second axial end substantially without any additional resistors, and wherein the supplying means is arranged to supply an AC current to the primary winding of the transformer.

4. A fluxgate magnetometer according to claim 3, wherein the voltage sensed by said sensing means is substantially proportional to the vector sum of the magnetic field flux density at all points along the fluxgate.

5. A fluxgate magnetometer according to claim 3, further comprising means for generating a magnetic flux at the fluxgate opposing the magnetic field to be measured by the fluxgate.

6. A fluxgate magnetometer according to claim 5, wherein the means for generating a magnetic flux at the fluxgate opposing the magnetic field to be measured by the fluxgate comprises means for supplying a DC current to the primary winding of the transformer.

7. A fluxgate magnetometer according to claim 2, wherein the connecting means electrically connects each set of windings to the shield via an electrical resistor, wherein the terminals of the secondary winding of the transformer are electrically connected via electrical resistors to the at least two sets of windings at the second axial end, and wherein the supplying means is arranged to supply an AC current to the primary winding of the transformer.

8. A fluxgate magnetometer according to claim 7, wherein the impedances of the electrical resistors connected to the at least two sets of windings at the second axial end are variable.

9. A fluxgate magnetometer according to claim 7, wherein selecting suitable impedance values for the electrical resistors connected to the at least two sets of windings at the second axial end enables the generation of standing electromagnetic waves along the fluxgate.

10. A fluxgate magnetometer according to claim 2, wherein the connecting means electrically connects each set of windings to the shield via an electrical resistor, wherein the terminals of the secondary winding of the transformer are electrically connected via electrical resistors to the at least two sets of windings at the second axial end, and wherein the supplying means is arranged to supply an electrical pulse to the primary winding of the transformer.

11. A fluxgate magnetometer according to claim 10, wherein selecting suitable impedance values for the electrical resistors connected to the at least two sets of windings at the first and second axial ends enables the generation of an electromagnetic pulse travelling back and forth along the fluxgate.

12. An access control system comprising a fluxgate magnetometer according to claim 1, and means for monitoring the voltage sensed by the sensing means.

13. A fluxgate magnetometer according to claim 1, wherein the at least two cores are flexible and the electrically conductive shield is flexible.

14. A fluxgate magnetometer according to claim 1, comprising an electrical insulation between said cores and said windings.

15. A fluxgate magnetometer according to claim 14, wherein the electrical insulation comprises at least two flexible, electrically insulating tubes, wherein each core is surrounded by a said tube and said sets of windings are wound around said tubes.

16. A fluxgate magnetometer according to claim 14, wherein the electrically conductive material of said windings is located within an electrically insulating material.

17. A fluxgate magnetometer according to claim 1, further comprising an insulating jacket provided around said shield.

18. A fluxgate magnetometer according to claim 17, wherein the insulating jacket is flexible.

19. A fluxgate magnetometer according to claim 1, wherein said cores are sufficiently thin so that the magnetic properties of said cores are not substantially altered by at least one of stress and strain induced by flexure.

20. A fluxgate magnetometer according to claim 1, wherein the length of the fluxgate is at least 0.5 m.

* * * * *